United States Patent [19]

Durtler et al.

[11] Patent Number: 5,438,683
[45] Date of Patent: Aug. 1, 1995

[54] AUTOMATIC LEVEL CONTROL CIRCUIT FOR DUAL MODE ANALOG/DIGITAL CELLULAR TELEPHONE

[75] Inventors: Willem G. Durtler, Calgary, Canada; Kiomars Anvari, Walnut Creek, Calif.; Chih C. Tsien, Calgary, Canada

[73] Assignee: NovAtel Communications, Ltd., Calgary, Canada

[21] Appl. No.: 308,636

[22] Filed: Sep. 19, 1994

Related U.S. Application Data

[63] Continuation of Ser. No. 844,132, Mar. 2, 1992, abandoned.

[51] Int. Cl.[6] .................. H04G 1/40; H03G 3/12; H03G 3/20
[52] U.S. Cl. .................. 455/74; 455/116; 455/126; 330/129; 330/284; 375/345
[58] Field of Search .................. 455/74, 89, 116, 126, 455/127, 93, 102, 249.1, 115; 375/5, 98; 330/284, 129, 141, 280, 281; 370/11; 379/58, 59

[56] References Cited

U.S. PATENT DOCUMENTS

| | | | |
|---|---|---|---|
| 4,371,842 | 2/1983 | Lee | 330/281 |
| 4,468,607 | 8/1984 | Tanaka et al. | 455/249.1 |
| 4,760,347 | 7/1988 | Li et al. | 330/127 |
| 4,952,886 | 8/1990 | Braathen et al. | 330/279 |
| 5,003,270 | 3/1991 | Braathen et al. | 330/279 |
| 5,054,116 | 10/1991 | Davidson | 455/126 |
| 5,060,294 | 10/1991 | Schwent et al. | 455/93 |
| 5,128,629 | 7/1992 | Trinh | 330/281 |
| 5,179,353 | 1/1993 | Miyaka | 330/284 |
| 5,193,223 | 3/1993 | Walczak et al. | 455/127 |
| 5,214,393 | 5/1993 | Aihara | 455/126 |

FOREIGN PATENT DOCUMENTS 2060292 10/1979 United Kingdom ................ 330/284

Primary Examiner—Reinhard J. Eisenzopf
Assistant Examiner—Lisa Charouel
Attorney, Agent, or Firm—Cesari and McKenna

[57] ABSTRACT

An automatic level control circuit for cellular telephone transmitters which is compatible with both existing analog cellular service and expected next generation digital TDMA service. The circuit automatically and dynamically changes modes to maintain communication when a mobile subscriber moves from one type of service to another. In a first mode of operation, which is compatible with existing analog cellular service, the circuit provides a closed loop negative feedback circuit which produces a control signal for continuously controlling the output power level of the transmitter amplifier. In a second mode of operation, which is compatible with proposed digital TDMA service, the circuit operates to alternately close the negative feedback loop during the periods when the transmitter is permitted to transmit (assigned TDMA frames) and open the loop during other periods when the transmitter is turned off. When the loop is opened, the invention temporarily stores the magnitude of the control signal. This stored value is subsequently used to quickly restore the amplifier to its assigned power level during successive frames when the loop is again closed for burst transmission.

11 Claims, 8 Drawing Sheets

AUTOMATIC LEVEL CONTROL CIRCUIT FOR DUAL MODE ANALOG/DIGITAL CELLULAR TELEPHONE

This application is a continuation of prior application Ser. No. 07/844,132 filed on Mar. 2, 1992, now abandoned.

BACKGROUND OF THE INVENTION

1. Field of the Invention

The present invention relates generally to the field of automatic level control for radio frequency (RF) power amplifiers and, more specifically, to automatic level control for a transmitter in a cellular telephone transceiver.

2. Discussion of the Prior Art

Cellular telephone systems presently in service in the United States and many other countries operate using analog, frequency modulated (FM) carrier signals. In accordance with prevailing operating protocols, two different carrier frequencies are used (one each for transmission and reception) for each call in which one of the parties is using a cellular transceiver. During the course of a call, analog transceivers transmit continuously using one of several discrete power levels which range from a few milliwatts to several watts. A transceiver's power level is dynamically assigned by the base station processing the call. A base station typically adjusts a given transceiver's power level in response to changes in the strength of the signal received by the base station from that transceiver. Thus, a transceiver which is relatively far away from the base station may be directed to transmit using the highest power level, while another transceiver in close proximity to the base station may be instructed to use a lower power level.

The prevailing protocol in the U.S. requires that the actual output power level of the transceiver remain within a narrow dynamic range around the assigned power level at all times and over a wide ambient temperature range. Such precise control is necessary to minimize interference between transceivers operating in close proximity.

In a proposed next generation of cellular telephone service, referred to as the EIA IS-54 Dual Mode Cellular System, communications are carried out in a significantly different fashion. First, in order to increase capacity through more efficient use of the electromagnetic spectrum allocated for cellular service, a time division multiple access (TDMA) protocol is proposed in which each communication channel (carrier frequency) is time divided into a cyclical series of time slots or "frames." Multiple transceivers share a single communication channel by transmitting information in digital form only during the frames assigned to them (burst transmission). During transmission, however, each transceiver uses a discrete output power level assigned by the base station, just as in current analog systems. In this manner, multiple simultaneous calls are carried by a single frequency, as opposed to one transmit carrier frequency per call as required by analog systems.

Since each transceiver may transmit only during designated frames (and not during other times), but must still adhere to the power level assigned by the base station, conventional output power control circuitry is generally incapable of satisfactory performance. For example, it is well known to use a negative feedback loop to control the output power level of a cellular telephone's transmitter. This is typically accomplished by providing suitable circuitry to sample the transmitter's output signal, to rectify the sample and then compare the rectified signal with a reference which is representative of the "correct" or desired power level. The difference or error signal yielded by the comparison is used to adjust the amplifier's output power level.

For this type of conventional feedback circuit to function, however, the transmitter or amplifier must operate continuously and the feedback loop must remained closed. That is, if the amplifier is turned off or the feedback loop is opened, control of the output power level is at least temporarily lost. Moreover, the loop response time of a conventional feedback circuit is typically too long (slow) in comparison with the duration of a frame in the proposed TDMA system. An excessively slow response time prevents the loop from stabilizing the output power level at the appropriate level before the frame has ended and the amplifier is no longer transmitting.

Similarly, the loop response time of a conventional feedback circuit is typically too short (fast) in comparison with the amplitude component of the digital modulation used in the proposed TDMA system. An adverse effect of the excessively short loop response time is that as the output power level varies in accordance with the amplitude modulation, the conventional feedback loop will tend to eliminate such variations and thus effectively eliminate the desired modulation. Thus, under the proposed TDMA system in which each transceiver transmits in "bursts" corresponding to its assigned frames, such conventional feedback circuits would not be capable of controlling the output power level as required by the protocol.

In addition, since base stations supporting the proposed TDMA protocol will be introduced gradually in most service areas and will not immediately supplant existing analog service in such areas, this transition gives rise to a compatibility problem. This problem is caused by the fact that some geographical areas will be served only by analog service while others will be served by TDMA service. Thus, as provided in the EIA IS-54 interim specification, next generation transceivers must be capable of operating with either type of service.

SUMMARY OF THE INVENTION

In brief summary, the present invention provides an automatic level control (ALC) circuit for cellular telephone transmitters which is compatible with both existing analog cellular service and expected next generation digital TDMA service. A cellular telephone transceiver which incorporates the invention may operate in either of two modes depending upon the type of service available for communication. Moreover, the invention automatically and dynamically changes modes to maintain communication when a mobile subscriber moves from one type of service to another.

In a first mode of operation, which is compatible with existing analog cellular service, the invention provides a closed loop negative feedback circuit which produces a control signal for continuously controlling the output power level of the transmitter amplifier.

In a second mode of operation, which is compatible with proposed digital TDMA service, the invention operates to alternately close the negative feedback loop during the periods when the amplifier is permitted to transmit (assigned frames) and open the loop during other periods when the transmitter is turned off. When the loop is opened, the invention temporarily stores the magnitude of the control signal. This stored value is subsequently used to quickly restore the amplifier to its assigned power level during successive frames when the loop is again closed for burst transmission. The stored value tends to prevent the amplifier from excessively overshooting its assigned power level and possibly causing interference with other subscribers. Further, in this mode of operation, the loop response time is sufficiently long, as compared to the period of the amplitude component of the digital signal, that the desired modulation is preserved while maintaining control of the output power level.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF ILLUSTRATIVE EMBODIMENTS

Figure 1:
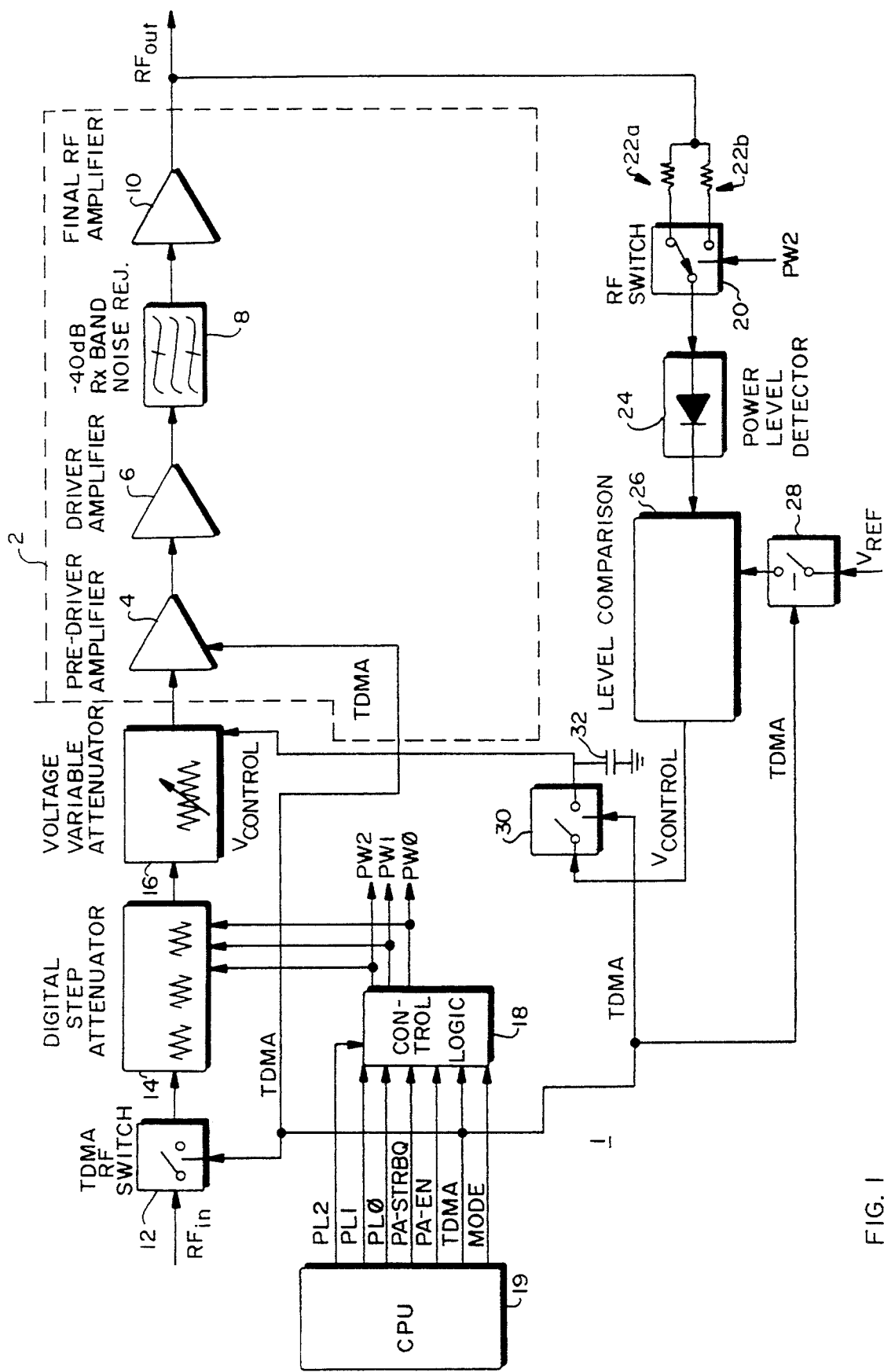
FIG. 1 is a block diagram of an amplifier which is controlled by an automatic level control circuit constructed in accordance with a preferred embodiment of the present invention.

FIG. 1 shows a cellular telephone transmitter 1 which includes an automatic level control circuit for controlling the power level of an output signal $RF_{out}$ produced by a multi-stage radio frequency (RF) amplifier 2. The RF amplifier 2 includes a pre-driver amplifier 4, a driver amplifier 6, a band-reject filter 8 (for attenuating noise whose frequencies lie within the cellular receive frequency band) and a final RF amplifier 10 arranged in series. For purposes of enhanced clarity, conventional circuitry such as potential sources for biasing the various components of RF amplifier 2 or other components are omitted.

Control logic 18 receives digital power level signals PL0, PL1, PL2, power amplifier-strobe-quiescent signal PA-STRBQ, power amplifier-enable signal PA-EN, TDMA and MODE as input signals and produces PW0, PW1, PW2 as digital output signals. All of the input signals applied to control logic 18 originate from a central processing unit (CPU) 19 which is conventionally used to provide overall control of the cellular telephone.

An input signal $RF_{in}$ passes via a TDMA RF switch 12, when the switch is closed, to a digital step attenuator 14. The position of switch 12 is controlled by the TDMA signal produced by CPU 19. The magnitude of attenuation provided by step attenuator 14 is controlled by output signals PW0, PW1 and PW2 produced by control logic 18. The attenuated output signal of step attenuator 14 is passed to a voltage variable attenuator 16 whose output signal is amplified by the RF amplifier 2. The magnitude of attenuation provided by the variable attenuator 16 is controlled by an analog signal $V_{control}$.

Output signal $RF_{out}$ is applied to two attenuators 22a and 22b. An RF switch 20, whose position is controlled by the PW2 signal produced by control logic 18, passes one of the attenuated signals to a power level detector 24. The output signal of the detector 24 (the detected signal) is applied to a level comparison circuit 26. A reference signal $V_{ref}$ is passed to the level comparison circuit 26 via a switch 28 whose position is controlled by the TDMA signal.

The level comparison circuit 26 produces a power control signal $V_{control}$ which is passed, via a switch 30 and capacitor 32, to the voltage variable attenuator 16. The position of switch 30 is controlled by the TDMA signal.

Figure 2:
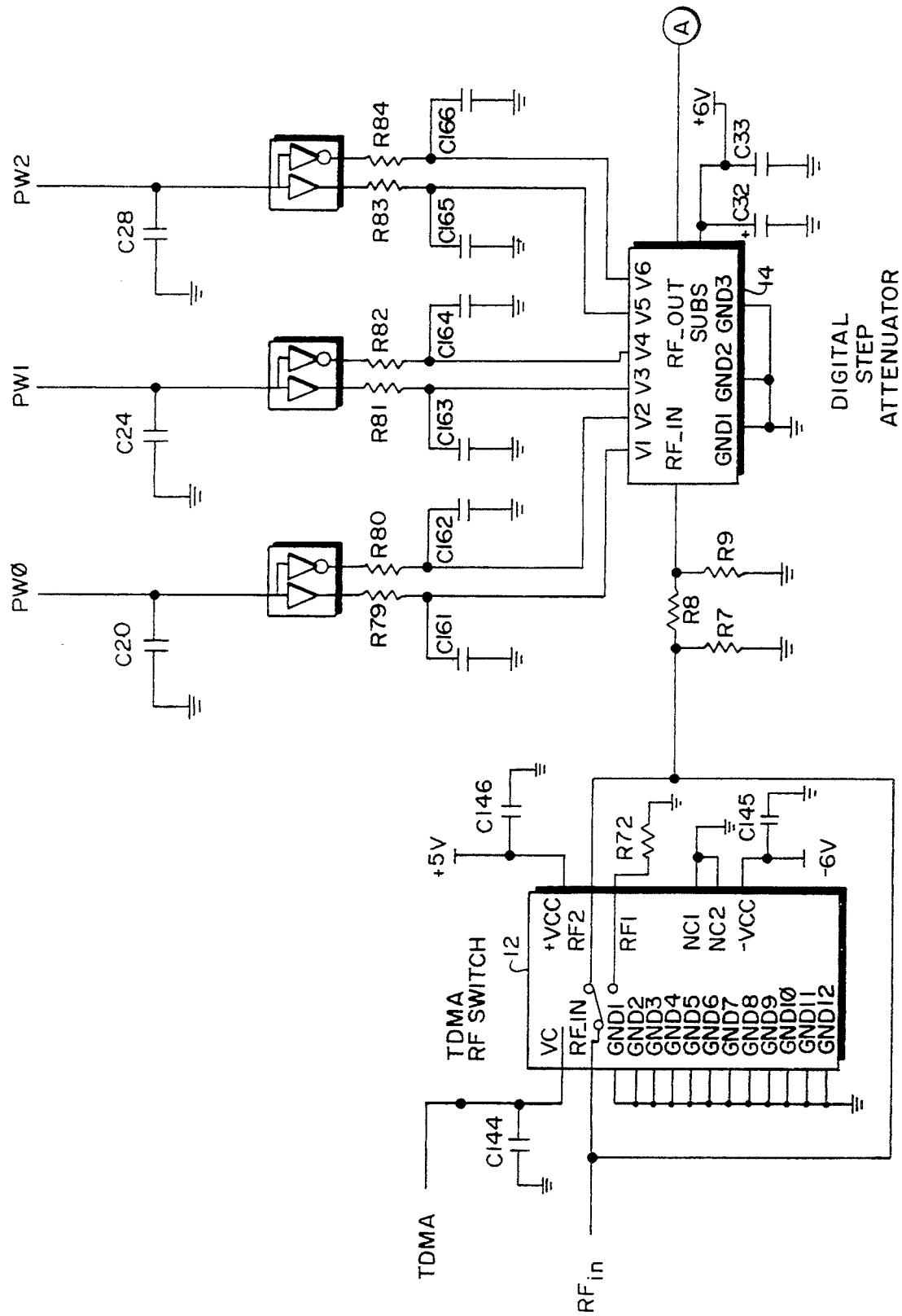
FIG. 2 is a detailed circuit diagram of the TDMA RF switch and digital step attenuator of FIG. 1.
Figure 3:
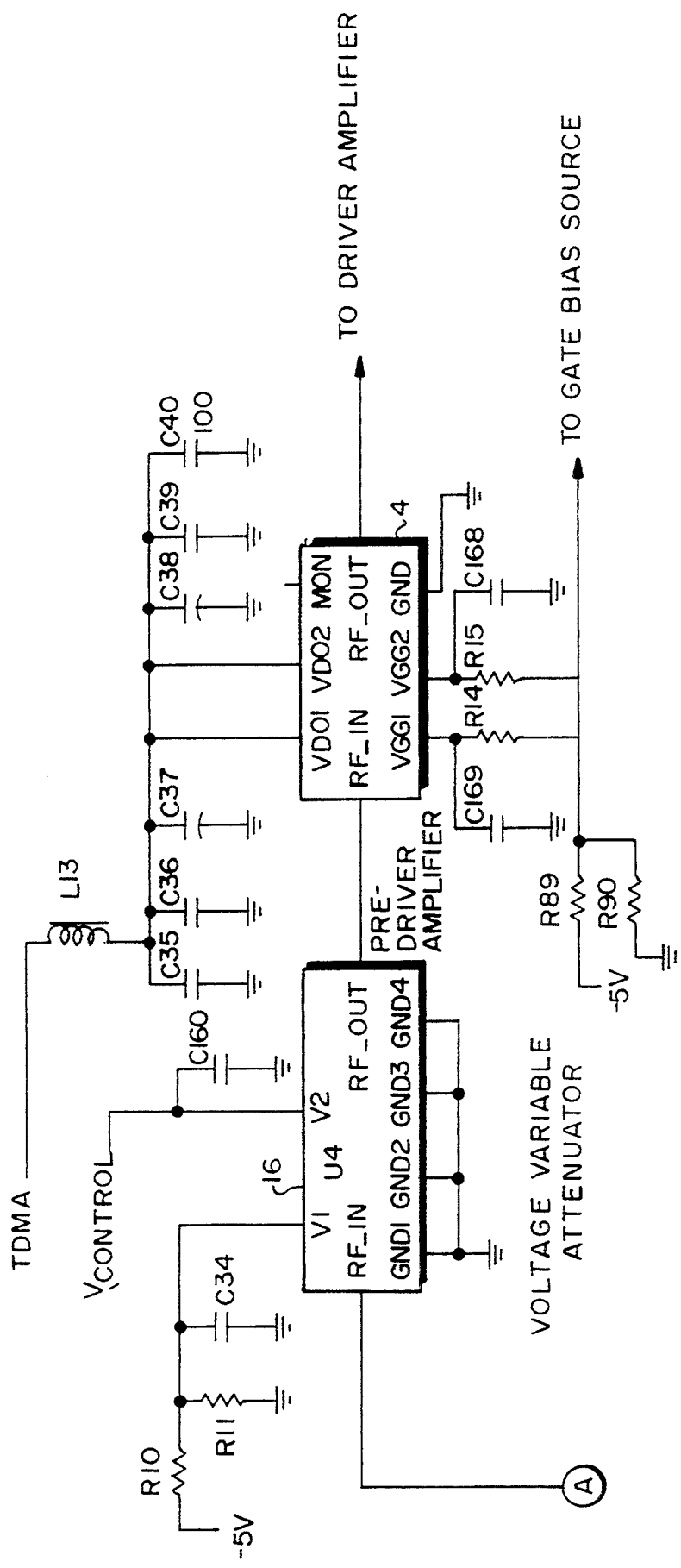
FIG. 3 is a detailed circuit diagram of the voltage variable attenuator and pre-driver amplifier of FIG. 1.

Referring now to FIGS. 2 and 3, it may be seen that during times when the TDMA signal is at one logical level, switch 12 is positioned as shown and $RF_{in}$ passes through, via the terminal denoted RF2, to the step attenuator 14. During times when the TDMA signal is at the complementary logical level, switch 12 changes position such that $RF_{in}$ is shunted to ground via the terminal RF1.

The step attenuator 14 attenuates the signal received at its terminal RF_IN by a discrete, preselected magnitude which is selected in response to the logical levels of PW0, PW1 and PW2. Those three signals (bits) select one of up to eight attenuation magnitudes which preferably cover the range 0 to 24 dB in 4 dB steps.

The attenuated signal produced by the step attenuator 14 is passed to the voltage variable attenuator 16, as indicated by reference letter A. The variable attenuator 16 further attenuates the signal and the magnitude of such attenuation is proportional to the time-varying magnitude of $V_{control}$ and functions as a fine adjust of the attenuated output signal produced by the step attenuator 14. Thus, the variable attenuator 16 effectively adjusts for temperature-related variations in certain components, differences in component values and the like. It should be understood that a single attenuator or other combination of two or more attenuators could be substituted for the step attenuator 14 and variable attenuator 16, depending upon the requirements of a particular application such as the desired power control precision, the level of circuit complexity which is acceptable, etc.

Figure 4:
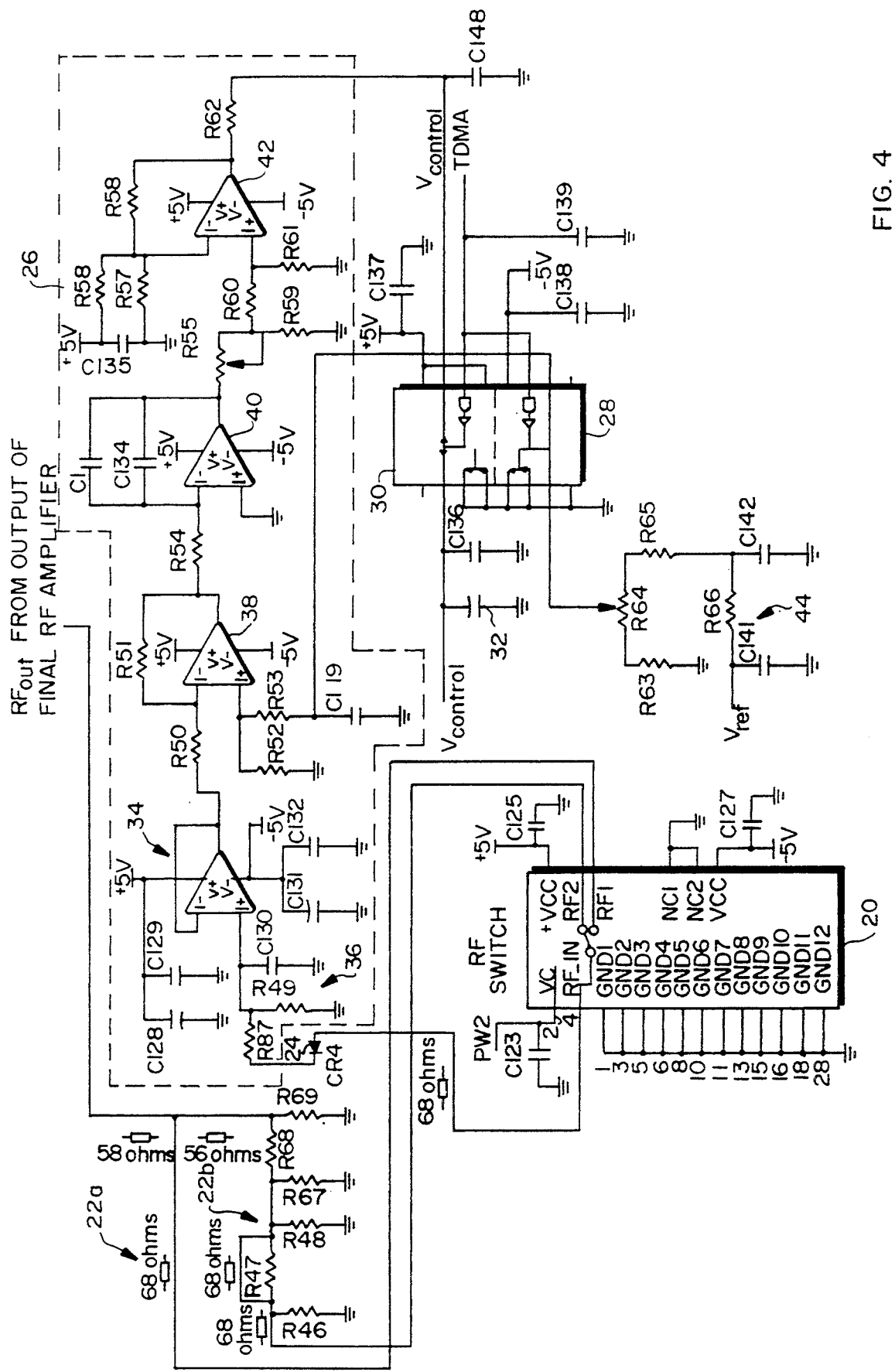
FIG. 4 is a detailed circuit diagram of the RF switch, power level detector and level control circuitry of FIG. 1.

FIG. 4 is a detailed diagram of the RF switch 20, attenuators 22, power level detector 24, level control circuitry 26 and switches 28 and 30 of FIG. 1. Attenuators 22a and 22b are constant impedance networks whose attenuation values are preferably chosen such that regardless of which of the eight transmit power levels is being used, the magnitude of the signal which is passed to detector 24 will fall within a relatively narrow dynamic range. The primary advantage of this arrangement is that the detector (diode) 24 may be biased at an optimal operating point (i.e., one at which no temperature compensation is required).

The rectified or detected signal produced by detector 24 passes, via a low pass smoothing filter 36 represented by resistor R49 and capacitor C130, to the non-inverting input of a buffer 34. The low pass filter preferably removes any remaining RF component from the detected signal produced by detector 24. Values for R49 and C130 are preferably chosen to provide the desired frequency response characteristic as well as a time constant which is much larger than the period of the transmit carrier frequency and sufficiently large compared with the period of the amplitude component of a TDMA digital signal to prevent the loop from cancelling the amplitude component (modulation).

The buffer 34 preferably provides a high impedance input which presents a stable load for the detector 24 as well as isolating the filter 36 from the next stage of the level comparison circuit 26.

The output signal of the buffer 34 is applied to the inverting input of a summing amplifier 38. The non-inverting input of the summing amplifier 38 receives the reference signal $V_{ref}$ via the switch 28. Thus, the output signal of summing amplifier 38 is an error signal indicative of the difference between the two signals applied to the inputs.

The error signal is applied to the inverting input of an integrator 40 whose output signal is the integral of the applied error signal. Integration of the error signal is preferred in order to force the error signal to zero during closed loop operation. The integrated error signal is then applied to the non-inverting input of a level adjusting amplifier 42 whose output signal is $V_{control}$, which is passed via switch 30 to the voltage variable attenuator 16 (FIG. 1).

Storage capacitor 32 is charged by $V_{control}$, which controls the output power level of RF amplifier 2, when switch 30 is closed. Consequently, the magnitude of the potential across capacitor 32 is proportional to the current output power level of the RF amplifier 2.

The reference signal $V_{ref}$ is applied to the switch 28 via a filter 44 formed by capacitor C141 and resistor R66. The filter 44 preferably smoothes glitches introduced in the reference signal $V_{ref}$ which may be introduced, for example, when a different power level is assigned by a base station and the magnitude of the reference signal is dynamically changed to reflect the new power level.

Representative modes of operation of the present invention will now be described with reference to FIG. 1.

Analog Mode of Operation

Assume that a subscriber is located in area served by analog cellular service. A base station, in accordance with prevailing protocols, uses a control channel to issue a command which instructs the subscriber's transceiver that analog service is present. The subscriber begins to place a call. The CPU 19 detects that the user is placing a call (e.g., by sensing that keys have been pressed on the handset) and in response sets various signals to predetermined logical levels. The MODE signal is set to a level to indicate to the control logic 18 that an "analog" operating mode should be used. The PA-EN signal is set to an appropriate level to indicate that the transceiver is now in an "active" (as opposed to "standby") state. In accordance with the assignment of a transmit power level by the base station, the CPU 19 sets PL0, PL1 and PL2 to the logical levels which represent the assigned power level. The TDMA signal is set to a logical level which (1) causes switch 12 to be or remain closed, (2) activates pre-driver amplifier 4, (3) causes switch 28 to be or remain closed, and (4) causes switch 30 to be or remain closed.

Also, during the analog operating mode, control logic 18 sets the logical levels of its output signals PW0, PW1 and PW2 so that they correspond, respectively, with the levels of PL0, PL1 and PL2.

The $RF_{in}$ signal is passed via the closed switch 12 and is attenuated by a preselected magnitude by the step attenuator 14. The attenuated signal is then passed to the variable attenuator 16 whose attenuation magnitude is proportional to the magnitude of the power control signal $V_{control}$. The signal received by the RF amplifier is amplified and filtered in a conventional manner to yield the $RF_{out}$ signal.

The $RF_{out}$ signal is attenuated by attenuators 22a and 22b and the RF switch 20 passes one of the attenuated signals to the detector 24. As the position of RF switch 20 is controlled by the logical level of PW2, it is preferred that PW2 represent the most significant bit of PW0, PW1 and PW2. In this fashion, switch 20 remains in one position during periods when the RF amplifier 2 is operating at any of the lower four of eight possible power levels and switches to the other position for the four higher power levels. It should be understood that a single attenuator or other combination of two or more attenuators could be used in place of attenuators 22a and 22b or that the "switch point" may be modified to meet the requirements of a particular application.

The detector (diode) 24 passes a detected signal to the level comparison circuit 26 which produces the power control signal $Vcontrol$, which is passed via the closed switch 30, to the variable attenuator 16. Thus, a negative feedback loop is closed around the RF amplifier 2 and the loop will operate in a conventional manner to reduce the integrated error signal to zero and thereby a maintain a steady output power level.

Digital (TDMA) Mode of Operation

Assume now that a subscriber is located in an area served by the proposed digital TDMA cellular service and the subscriber begins to place a call. Again, as specified in the proposed standard EIA IS-54 Dual Mode Cellular System, a base station issues a command to the subscriber's transceiver which indicates that TDMA service is in use. In response, the CPU 19 sets the MODE signal to a logical level to indicate to the control logic 18 that a "digital TDMA" operating mode should be used. As before, the CPU 19 sets PL0, PL1 and PL2 to levels which represent the power level assigned by the base station.

Figure 5:
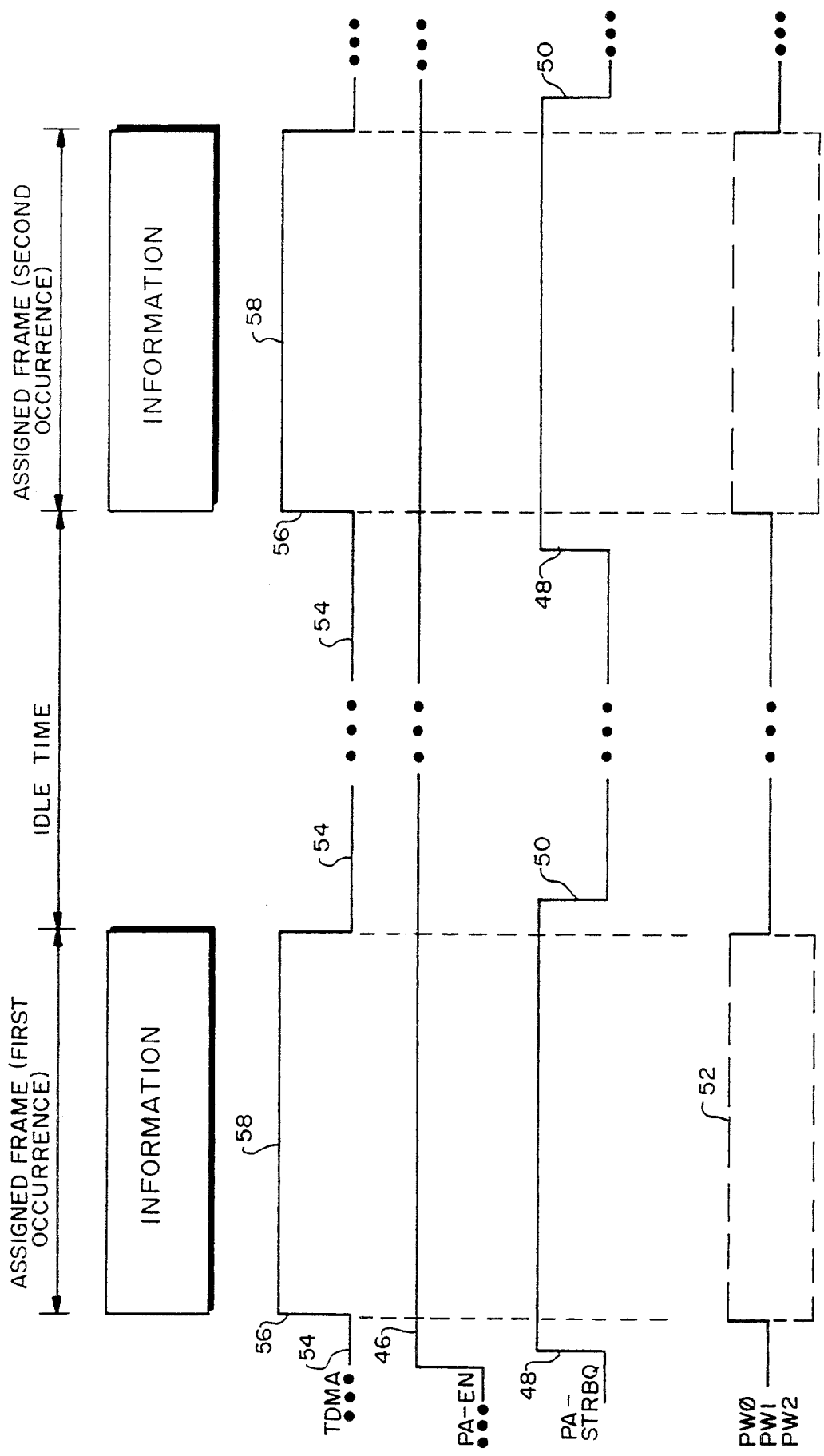
FIG. 5 is a timing diagram showing the relationship between certain control signals depicted in FIG. 1 during a digital TDMA mode of operation.

Referring now to both FIGS. 1 and 5, the CPU 19 sets the PA-EN signal to a level, indicated by reference numeral 46, which indicates to the control logic 18 that the transceiver is in an active state. The PA-EN signal level remains at the same level until the transceiver is placed in a standby state (i.e., the call is terminated), at which time the level is changed to reflect the change in state.

The PA-STRBQ signal, as indicated by reference numeral 48, is set just prior to the beginning of an assigned frame (during the which the transceiver may transmit) to a level which indicates to the control logic 18 that an assigned frame is about to begin. Slightly after the expiration of an assigned frame, the level of the PA-STRBQ signal changes (reference numeral 50) to indicate to the control logic 18 that the assigned frame has ended.

In synchronization with the beginning and end of an assigned frame, the control logic 18 sets the levels of PW0, PW1 and PW2 so that they correspond with the levels of PL0, PL1 and PL2, respectively, as indicated by reference numeral 52.

The TDMA signal is initially set to a logical level, as indicated by reference numeral 54, which (1) causes switch 12 to be or remain open, (2) deactivates pre-driver amplifier 4, (3) causes switch 28 to be or remain open, and (4) causes switch 30 to be or remain open. Since switch 12 is open, $RF_{in}$ is shunted to ground and the magnitude of $RF_{out}$ goes to zero. The deactivation of pre-driver 4 and opening of switch 30 present high impedances to prevent discharge of the capacitor 32 which stores the magnitude of $V_{control}$ during idle times for use during subsequent transmission.

At the beginning of an assigned frame, the TDMA signal level changes as indicated by reference numeral 56. This change in level of the TDMA signal causes switch 12 to close (allowing $RF_{in}$ to pass through), reactivates the pre-driver amplifier 4, and causes switches 28 and 30 to close, thereby allowing application of $V_{ref}$ to the level comparison circuit 26 and application of the stored value of $V_{control}$ to the variable attenuator 16. At the end of an assigned frame, the TDMA signal returns to its initial level and this process is repeated cyclically until the termination of the call.

To summarize, when the TDMA signal is at the level indicated by reference numeral 58, the feedback loop is closed and the output power level of RF amplifier 2 is controlled as described above in connection with the analog mode of operation. When the TDMA signal is at the level indicated by reference numeral 54, the feedback loop is open, the RF amplifier 2 produces no output signal, but the magnitude of the control signal $V_{control}$ is stored by capacitor 32 for immediate application to the variable attenuator 16 at the beginning of the next assigned frame when the TDMA signal level changes again.

Assume now that a mobile subscriber initiates or receives a call in an area covered by analog service, meaning that the transceiver's transmitter is operating in the analog mode as described above, but during the course of the call the subscriber travels into an area served by digital TDMA service. This type of transition may occur, for example, at a boundary between two cells, each of which is served by its own base station.

Under current operating protocol, as well as the proposed standard EIA IS-54 Dual Mode Cellular System, a procedure known as a "hand-off" is executed in which, automatically and transparently to the subscriber, control of the call is passed from one base station to the other without interruption of communication. The present invention fully supports the hand-off procedure both when the same type of service is in use by both stations and when different types of service are in use. As described above, the base station which is controlling the call at any given time issues a command to the subscriber's transceiver identifying which type of service is in use at that time. The present invention responds to such commands dynamically and without intervention by the subscriber, thus maintaining continuous communication.

Figure 6:
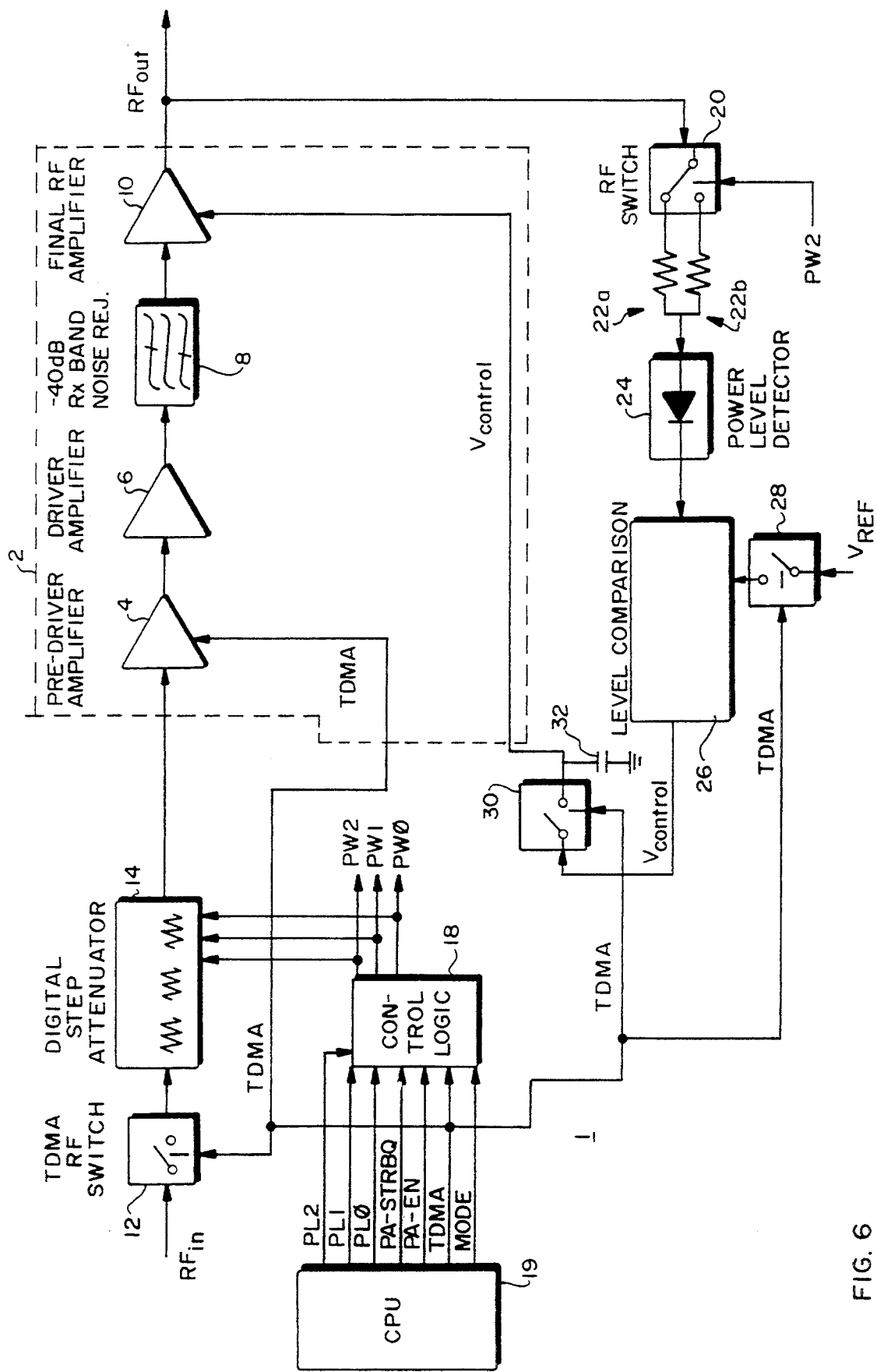
FIG. 6 is a block diagram of an alternative embodiment of the present invention.

An alternative embodiment of the present invention is shown in FIG. 6. In this embodiment, the voltage variable attenuator 16 is eliminated and the control voltage $V_{control}$ is instead applied to final RF amplifier 10. Consequently, changes in the magnitude of $V_{control}$ cause corresponding changes in the collector voltage of the final RF amplifier 10, thereby proportionately increasing or decreasing the power level of $RF_{out}$. This embodiment may provide more precise power control during the analog operating mode described above, whereas the embodiment of FIG. 1 may provide more precise control during the digital TDMA mode. It should be understood by those skilled in the art that further improvement in performance may be obtained by dynamically changing the bias applied to the components of RF amplifier 2 in accordance with the prevailing operating mode.

Figure 7:
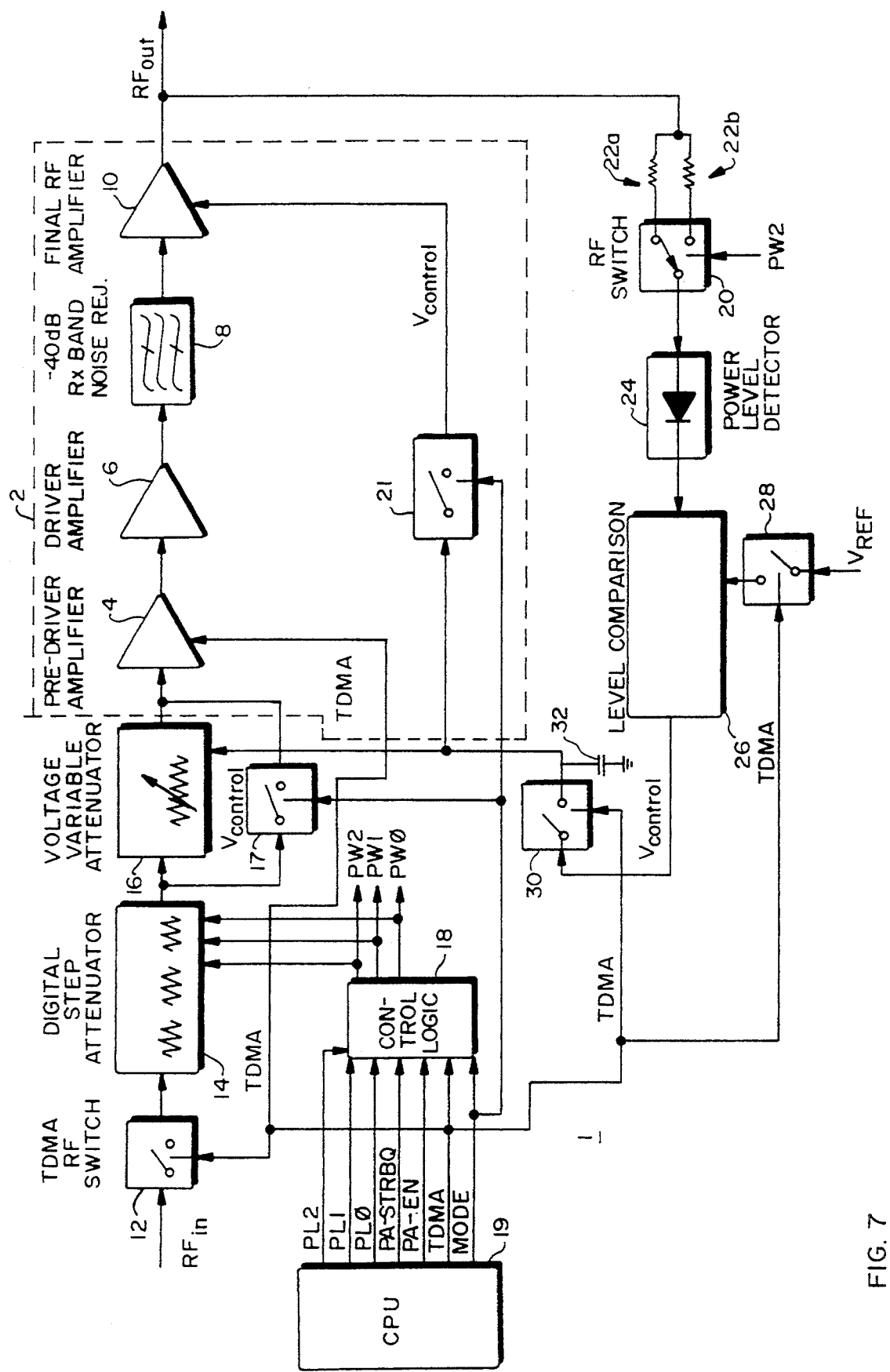
FIG. 7 is a block diagram of a second alternative embodiment of the present invention.

A third embodiment of the present invention, which is essentially a combination of the embodiments of FIGS. 1 and 6, is shown in FIG. 7. A switch 17, whose position is controlled by the MODE signal, is connected in parallel with the voltage variable attenuator 16. A switch 21, whose position is also controlled by the MODE signal, is connected in series between the capacitor 32 and the final RF amplifier 10.

When the MODE signal is set to the logical level which represents the analog operating mode, switches 17 and 21 are closed, meaning that the variable attenuator 16 is bypassed and power level of $RF_{out}$ is adjusted by changes in $V_{control}$ causing corresponding changes in the collector voltage of final RF amplifier 10. Thus, in the analog operating mode, the transmitter 1 of FIG. 7 operates in a manner similar to that of the transmitter 1 of FIG. 6.

When the MODE signal is set to the logical level which represents the digital TDMA mode, switches 17 and 21 are open. In this mode, the transmitter 1 of FIG. 7 operates in a manner similar to that of the transmitter 1 of FIG. 1.

Figure 8:
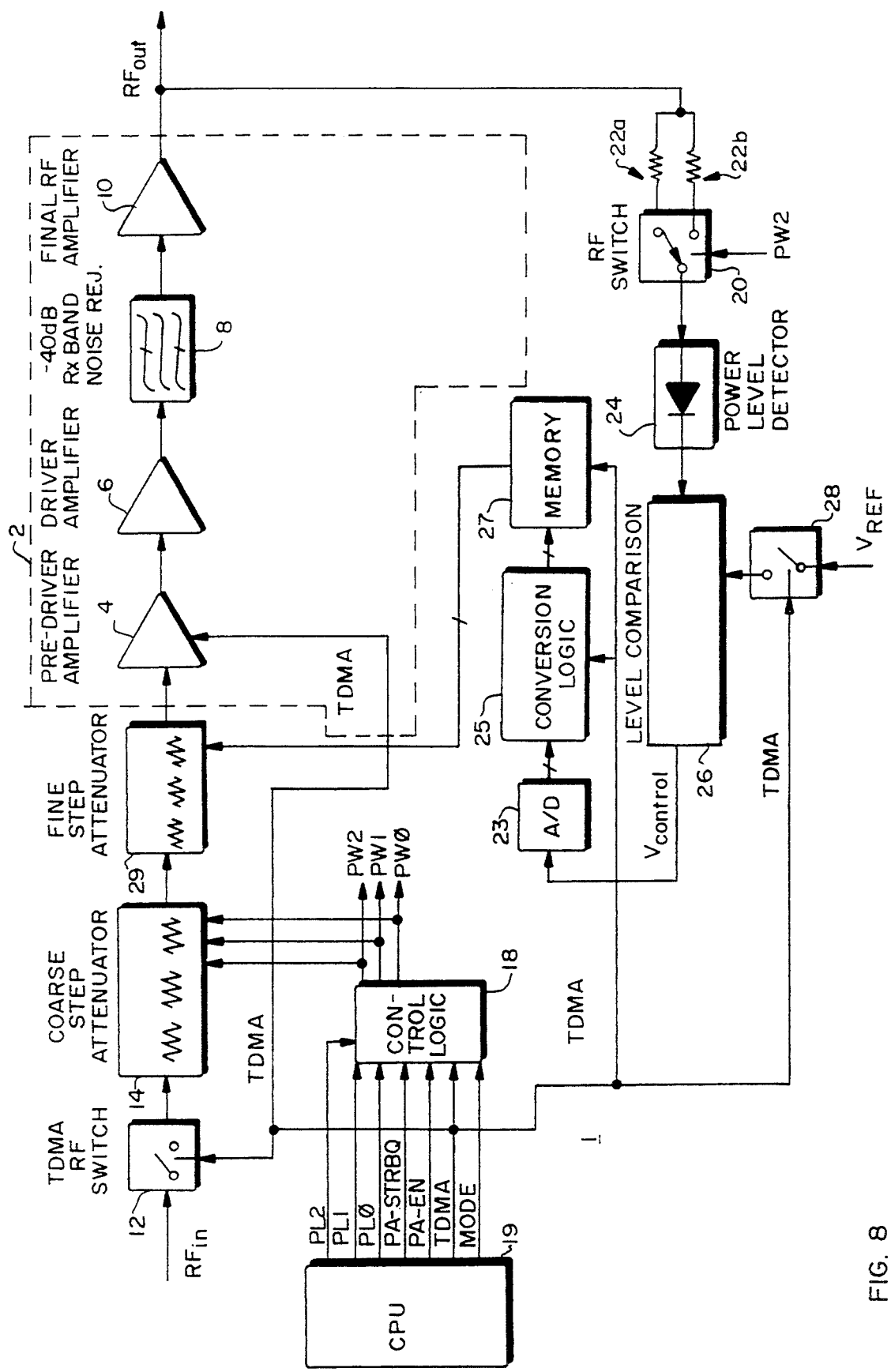
FIG. 8 is a block diagram of a third alternative embodiment of the present invention which incorporates a digital control signal and fine step attenuator.

FIG. 8 shows a fourth embodiment of the present invention. Here, the variable attenuator 16 is replaced by a fine step attenuator 29 which, in conjunction with coarse step attenuator 15, adjusts the power level of $RF_{out}$. In addition, the analog signal $V_{control}$ is applied to an analog-to-digital converter (A/D) 23, whose digital output signal is applied via conversion logic 25 and a memory 27 to the fine step attenuator 29. The conversion logic 25 and memory 27 are controlled by the TDMA signal. In addition, it should be understood by those skilled in the art that certain portions of level comparison circuit 26, such as the level adjuster 42 (FIG. 4), may not be required or may require modification since $V_{control}$ is being converted to a digital signal.

When the TDMA signal is set to the logical level which represents analog operating mode, the conversion logic 25 operates to convert the digital output signal of A/D 23 to a digital power control signal which is in turn applied to the fine step attenuator 29.

Conversely, when the TDMA signal is set to the logical level which represents the digital TDMA operating mode, switch 12 is open, pre-driver amplifier 4 is deactivated and the final RF amplifier 10 produces no output signal. However, memory 27 stores the digital power control signal last produced by the conversion logic 25, in a manner analogous to capacitor 32 of FIGS. 1, 6 and 7, so that when the logical level of TDMA subsequently changes (i.e. at the beginning of an assigned frame), the stored digital control signal is available for immediate application to the fine step attenuator 29.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. In a cellular telephone transceiver, a radio frequency amplifier for amplifying either an analog input signal or a digital input signal, said radio frequency amplifier comprising:

a variable attenuator, responsive to a power control signal, for receiving and attenuating digital associated signals associated with the digital input signal to produce an attenuated signal and passing the attenuated signal to a controllable-gain amplifier during a first mode of operation, said controllable-gain amplifier amplifying said attenuated signal to produce an amplifier output signal associated with said digital input signal;

switching means for allowing analog associated signals associated with the analog input signal to bypass said variable attenuator and for applying said power control signal to said controllable-gain amplifier during a second mode of operation said controllable-gain amplifier producing an amplifier output signal associated with said analog input signal;

a detector connected to receive the amplifier output signal produced by said controllable-gain amplifier and responsively produce a detected signal indicative of the power level of the amplifier output signal;

means for comparing the detected signal to a preselected reference signal and responsively producing said power control signal such that said power control signal is indicative of a difference between said detected signal and said reference signal;

control means, responsive to an operating mode signal, for alternately storing the power control signal and applying the power control signal to the variable attenuator during the first mode of operation; and means for producing said operating mode signal.

2. The radio frequency amplifier of claim 1 further comprising a step attenuator for receiving and attenuating either of said analog or digital input signals to produce, respectively, the analog associated signal or the digital associated signal and passing that signal to the switching means, said step attenuator responsive to one or more power level signals which represent a preselected power level for said amplifier output signal.

3. The radio frequency amplifier of claim 1 further comprising means for sampling and attenuating the amplifier output signal by one of a plurality of predetermined values and passing the attenuated amplifier output signal to the detector, whereby variation in the magnitude of the attenuated amplifier output signal is substantially reduced as compared to variation in the magnitude of the amplifier output signal.

4. The radio frequency amplifier of claim 3 wherein the detector comprises a diode and the variation in the magnitude of the attenuated amplifier output signal is sufficiently reduced such that said diode does not require temperature compensation.

5. The radio frequency amplifier of claim 3 wherein the sampling and attenuating means comprises a plurality of impedances connected to a switch, and said switch receives the amplifier output signal and, via one of said impedances, attenuates the amplifier output signal to produce said attenuated amplifier output signal and applies said attenuated amplifier output signal to said detector.

6. The radio frequency amplifier of claim 1 wherein said means for comparing includes a low pass filter for removing higher frequency components from the detected signal to produce a filtered detected signal, a summing amplifier for producing an error signal which is indicative of a difference in magnitude between the filtered detected signal and the preselected reference signal, an integrator for integrating the error signal to produce an integrated error signal, and a level adjuster for adjusting the magnitude of the integrated error signal to produce the power control signal.

7. The radio frequency amplifier of claim 1 wherein the operating mode signal has first and second logical levels for defining said first and second modes of operation, respectively.

8. The radio frequency amplifier of claim 1 wherein during the first operating mode said controllable-gain amplifier amplifies said digital associated signal and said power control signal is alternately applied to said controllable-gain amplifier during predetermined periods when said transceiver is transmitting and stored during periods when said transceiver is not transmitting.

9. The radio frequency amplifier of claim 1 wherein the control means includes a capacitor which is charged by said power control signal.

10. In a cellular telephone transceiver, a method for controlling a power level of an output signal produced by an amplifier, said amplifier being capable of producing the amplifier output signal associated with either an analog input signal during an analog mode of operation or a digital input signal during a digital mode of operation, said method comprising the steps of:

A. determining whether to use the analog mode of operation or the digital mode of operation;

B. detecting the amplifier output signal and responsively producing a detected signal which is indicative of the power level of the output signal;

C. comparing the detected signal to a preselected reference signal and responsively producing a power control signal which is indicative of a difference between said detected signal and said reference signal;

D. during the analog mode of operation, forgoing attenuation and applying to the amplifier an associated analog signal that is associated with the analog input signal, and using the power control signal to continuously adjust the power level of the amplifier output signal produced by the amplifier in response to the associated analog signal;

E. during the digital mode of operation, alternately storing the power control signal and using the power control signal to adjust a variable attenuator, the variable attenuator receiving an associated digital signal that is associated with the digital input signal and attenuating the associated digital input signal to produce an attenuated input signal, said variable attenuator passing the attenuated input signal to the amplifier.

11. The method of claim 10 further including the step of applying either the analog input signal or the digital input signal to a step attenuator, said step attenuator producing respectively the associated analog signal or the associated digital signal associated with the applied analog or digital input signal, and using this signal in step D if operating in the analog mode or step E if operating in the digital mode.

* * * * *